United States Patent
Holt et al.

(10) Patent No.: US 8,084,788 B2
(45) Date of Patent: Dec. 27, 2011

(54) METHOD OF FORMING SOURCE AND DRAIN OF A FIELD-EFFECT-TRANSISTOR AND STRUCTURE THEREOF

(75) Inventors: Judson Robert Holt, Wappingers Falls, NY (US); Abhishek Dube, Fishkill, NY (US); Eric C. T. Harley, Lagrangeville, NY (US); Shwu-Jen Jeng, Wappingers Falls, NY (US); Jeremy J Kempisty, Poughkeepsie, NY (US); Hasan Munir Nayfeh, Poughkeepsie, NY (US); Keith Howard Tabakman, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 12/248,970

(22) Filed: Oct. 10, 2008

(65) Prior Publication Data

US 2010/0090288 A1    Apr. 15, 2010

(51) Int. Cl.
*H01L 29/76* (2006.01)
*H01L 29/00* (2006.01)

(52) U.S. Cl. . 257/213; 257/192; 257/369; 257/E27.098; 257/E21.661

(58) Field of Classification Search .................. 257/18, 257/19, 55, 63, 190, 194, 255, E29.193, E27.098, 257/E21.661, 369, 213
See application file for complete search history.

(56) References Cited

U.S. PATENT DOCUMENTS

| | | | |
|---|---|---|---|
| 7,214,598 B2 | 5/2007 | Capewell et al. | |
| 2008/0079033 A1* | 4/2008 | Waite et al. | 257/255 |
| 2008/0166847 A1 | 7/2008 | Utomo et al. | |

* cited by examiner

*Primary Examiner* — Evan Pert
*Assistant Examiner* — Selim Ahmed
(74) *Attorney, Agent, or Firm* — Howard Cohn; Yuanmin Cai

(57) ABSTRACT

A semiconductor fabrication method involving the use of eSiGe is disclosed. The eSiGe approach is useful for applying the desired stresses to the channel region of a field effect transistor, but also can introduce complications into the semiconductor fabrication process. Embodiments of the present invention disclose a two-step fabrication process in which a first layer of eSiGe is applied using a low hydrogen flow rate, and a second eSiGe layer is applied using a higher hydrogen flow rate. This method provides a way to balance the tradeoff of morphology, and fill consistency when using eSiGe. Embodiments of the present invention promote a pinned morphology, which reduces device sensitivity to epitaxial thickness, while also providing a more consistent fill volume, amongst various device widths, thereby providing a more consistent eSiGe semiconductor fabrication process.

13 Claims, 7 Drawing Sheets

METHOD OF FORMING SOURCE AND DRAIN OF A FIELD-EFFECT-TRANSISTOR AND STRUCTURE THEREOF

RELATED APPLICATIONS

The present Application is a Continuation-In-Part Application of U.S. application Ser. No. 12/248,970 filed on Oct. 10, 2008.

FIELD OF THE INVENTION

The present invention relates generally to the manufacturing of semiconductor devices, and in particular, to the formation of source and drain of a field-effect-transistor.

BACKGROUND OF THE INVENTION

In the field of semiconductor integrated circuit (IC) manufacturing, active semiconductor devices, e.g. transistors, are generally manufactured or formed by applying well-known front end of line (FEOL) technologies. A transistor may be a field-effect-transistor (FET), e.g. a complementary metal-oxide-semiconductor (CMOS) FET, and the FET may be a p-type doped FET (pFET) or an n-type doped FET (nFET). Different types of transistors may be manufactured on a common substrate of semiconductor chip or structure.

One approach for improving semiconductor performance is to increase carrier (electron and/or hole) mobilities. Increased carrier mobility can be obtained, for example, by introducing an appropriate strain/stress into the Si lattice of the silicon (Si)-containing substrate that is used to fabricate the semiconductor device into the finished product of an integrated circuit.

The application of stress along the channel changes the lattice dimensions of the silicon (Si)-containing substrate that is used to fabricate the semiconductor device. By changing the lattice dimensions, the band structure and mobility of the material are changed as well.

In most recent several years, efforts of continuing to scale FET devices have been mainly focused on the area of stress engineering. For example, in the case of manufacturing pFET devices, incorporation of compressive stress liners and/or stressors of embedded SiGe (eSiGe) in source and drain regions have successfully demonstrated improvement in performance of the pFET devices.

In order to further enhance performance of the pFET devices, it is desirable to develop new techniques involving the use of eSiGe in semiconductor fabrication.

SUMMARY OF EMBODIMENTS OF THE INVENTION

According to embodiments of the present invention, it is provide a transistor formed within a substrate. The transistor includes a source region, a drain region, a channel region disposed between the source region and the drain region and a gate disposed above the channel region. The source region and the drain region include a base layer of low flow hydrogen embedded silicon germanium (eSiGe) deposited by a first hydrogen carrier gas flow of 5 to 10 standard liters per minute (slm) and a top layer of high flow hydrogen eSiGe deposited by a hydrogen gas flow of 11 to 50 slm on the base layer. The base layer extends to a level of about 2 nanometers to about 10 nanometers below the bottom of the gate and the top layer induces a pinned morphology.

In one embodiment, a ratio of depth of the top layer to depth of the base layer, of the transistor, ranges from about 0.1 to about 0.4.

In one embodiment, the transistor has a device width ranging from about 30 nanometers to about 100 nanometers; yet in another embodiment, the transistor has a device width that is less than the combined thickness of the base layer and the top layer.

In one embodiment, the base layer and top layer of the transistor have a germanium concentration level ranging from about 15 percent to about 40 percent.

In another embodiment, the base layer of the transistor has a germanium concentration level ranging from about 30 percent to about 40 percent and the top layer has a germanium concentration level of about 20 percent.

According to embodiments of the present invention, it is provided an SRAM device that includes a plurality of transistors formed within a substrate. The transistors have a source region; a drain region; a channel region disposed between the source region and the drain region; and a gate disposed above the channel region. The source region and the drain region include a base layer of low flow hydrogen eSiGe and a top layer of high flow hydrogen eSiGe deposited on the base layer. The base layer extends to a level of about 2 nanometers to about 10 nanometers below the bottom of the gate and the top layer induces a pinned morphology.

In another embodiment, SRAM device, the base layer of low flow hydrogen eSiGe is deposited by a hydrogen carrier gas flow of 5 to 10 slm to a level below a bottom surface of the gate and the top layer of high flow hydrogen eSiGe is deposited by a hydrogen gas flow of 11 to 50 slm on the base layer.

In another embodiment of the SRAM device, at least one of the plurality of transistors has a ratio of depth of the top layer to depth of the base layer in the range from about 0.1 to about 0.4.

Another embodiment of the invention provides a method for forming a source and drain in a field effect transistor. The method includes the steps of: providing a substrate having a source region cavity, a drain region cavity and a channel region disposed between the source and drain cavities; and a gate disposed above the channel region;

depositing a first layer of low flow hydrogen eSiGe with a hydrogen carrier gas flow of 5 to 10 slm in the source and drain region cavities to a level from about 2 nanometers to about 10 nanometers below the gate; and depositing a first eSiGe layer in the source and drain regions.

In another embodiment, the step of depositing the first and second eSiGe layers includes selecting a ratio of depth of the second eSiGe layer to the depth of the first eSiGe layer in the ranges from about 0.1 to about 0.4.

In one embodiment, the step of depositing the first eSiGe layer and the step of depositing the second eSiGe layer is performed via chemical vapor deposition.

In another embodiment, the step of performing chemical vapor deposition includes performing rapid thermal chemical vapor deposition. For example, in one embodiment, the step of performing rapid thermal chemical vapor deposition is performed at a temperature ranging from about 600 degrees Centigrade to about 900 degrees Centigrade.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

In the drawings accompanying the description that follows, often both reference numerals and legends (labels, text descriptions) may be used to identify elements. If legends are provided, they are intended merely as an aid to the reader, and should not in any way be interpreted as limiting.

DETAILED DESCRIPTION OF EMBODIMENTS

While the eSiGe approach is useful for applying the desired stresses to the channel region of a field effect transistor, various challenges have been prevalent, which complicate its use in semiconductor fabrication. One issue is that important parameters such as the threshold voltage (Vt) and overlap capacitance (Cov) are effected by variations in the fill level of the eSiGe material in the source and drain regions. It is desirable to produce consistent semiconductor devices with minimal variation amongst the various lots. Therefore, it is desirable to maintain a consistent fill height. However, variation in fill height can come from a variety of factors, including variations in etch of the source and drain cavities, as well as variation in the deposition (growth) of the eSiGe material. However, in current eSiGe techniques, steps taken to achieve a consistent eSiGe fill across different recess shapes and device widths may induce a condition where the eSiGe rises above the lower portion of the gate, a phenomenon known as a "popped spacer" or "popping" in the industry. When the eSiGe is in a popped condition, the eSiGe fill height (and therefore the device paramaters) becomes highly variable.

Hence, there is a tradeoff between fill consistency, and avoiding a popped condition. With currently used methods, taking steps to improve fill consistency induces popping. Conversely, taking steps to reduce popping also reduces fill consistency. As will be explained in more detail below, embodiments of the present invention may address this tradeoff, achieving more consistent eSiGe fill levels, and also providing an eSiGe morphology (shape) that induces the desired stress in the channel region of the field effect transistor, while also reducing the device sensitivity (of important parameters such as Vt and Cov) to the eSiGe fill height, allowing for a more consistent semiconductor fabrication process.

In order to fully understand and appreciate embodiments of the present invention, prior art devices will be briefly discussed first.

Figure 1A:
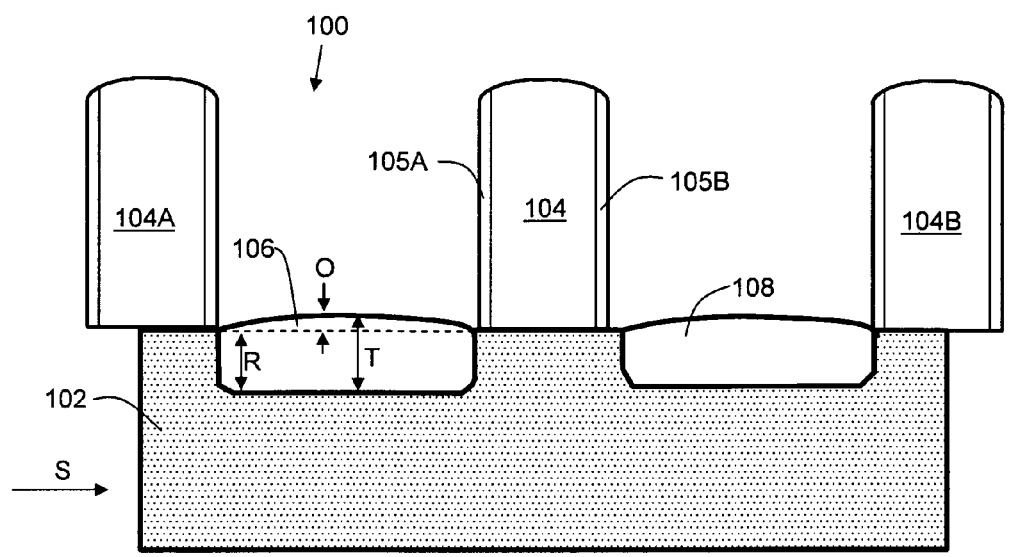
FIG. 1A shows a front view of a prior art field effect transistor with embedded SiGe.

FIG. 1A shows a front view of a prior art field effect transistor 100. Transistor 100 comprises substrate 102, and gate structure 104. Adjacent to gate structure 104 are spacers 105A and 105B. Source 106 is comprised of eSiGe material deposited in a cavity that is etched in substrate 102. Similarly, drain 108 is also comprised of eSiGe material deposited in a cavity that is etched in substrate 102. Typically, additional gate structures (104A, 104B) are present on the other side of the source and drain, forming part of a larger integrated circuit. For the purposes of defining some measurement parameters, source 106 is annotated as follows: R is the recess height, and is the distance from the top surface of substrate 102 to the bottom of source 106. T is the thickness of the epitaxial growth (sometimes referred to as "epi thickness") and is the distance from the top of the source 106 at its highest point, to the bottom of source 106. O is the overfill distance, which is equal to T-R, and is a measure of how far over the recess height the eSiGe material has been deposited. Note that it is possible to have a negative value for O, which indicates an under filled source. While the above parameters have been described with respect to source 106, they also apply to drain 108.

Figure 1B:
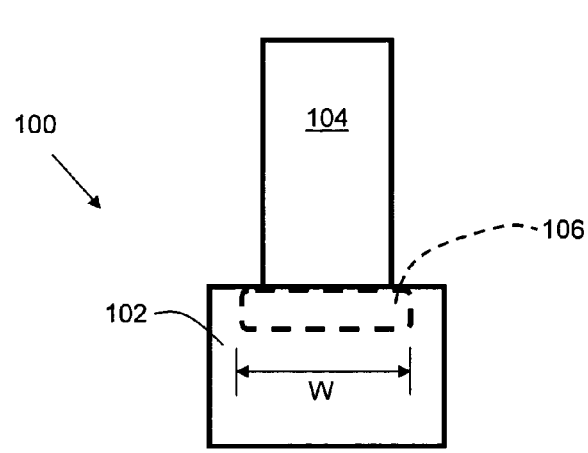
FIG. 1B shows a side view of a prior art field effect transistor with embedded SiGe.

FIG. 1B shows a side view of field effect transistor 100 as viewed from the direction of arrow S in FIG. 1A. In this figure, parameter W is the width of the device. The width of the device also affects the fill levels of eSiGe. In particular, it may be more difficult to achieve consistent fill levels in narrow devices, such as SRAM (static random access memory) devices. The width W varies depending on the technology, as well as other factors, and may have a width W in the range of about 30 nm to 100 nm. Regardless of the width, if the device width W is approximately the same as, or less than, the epi thickness T, the aforementioned undesirable morphology effects may be present.

Figure 2:
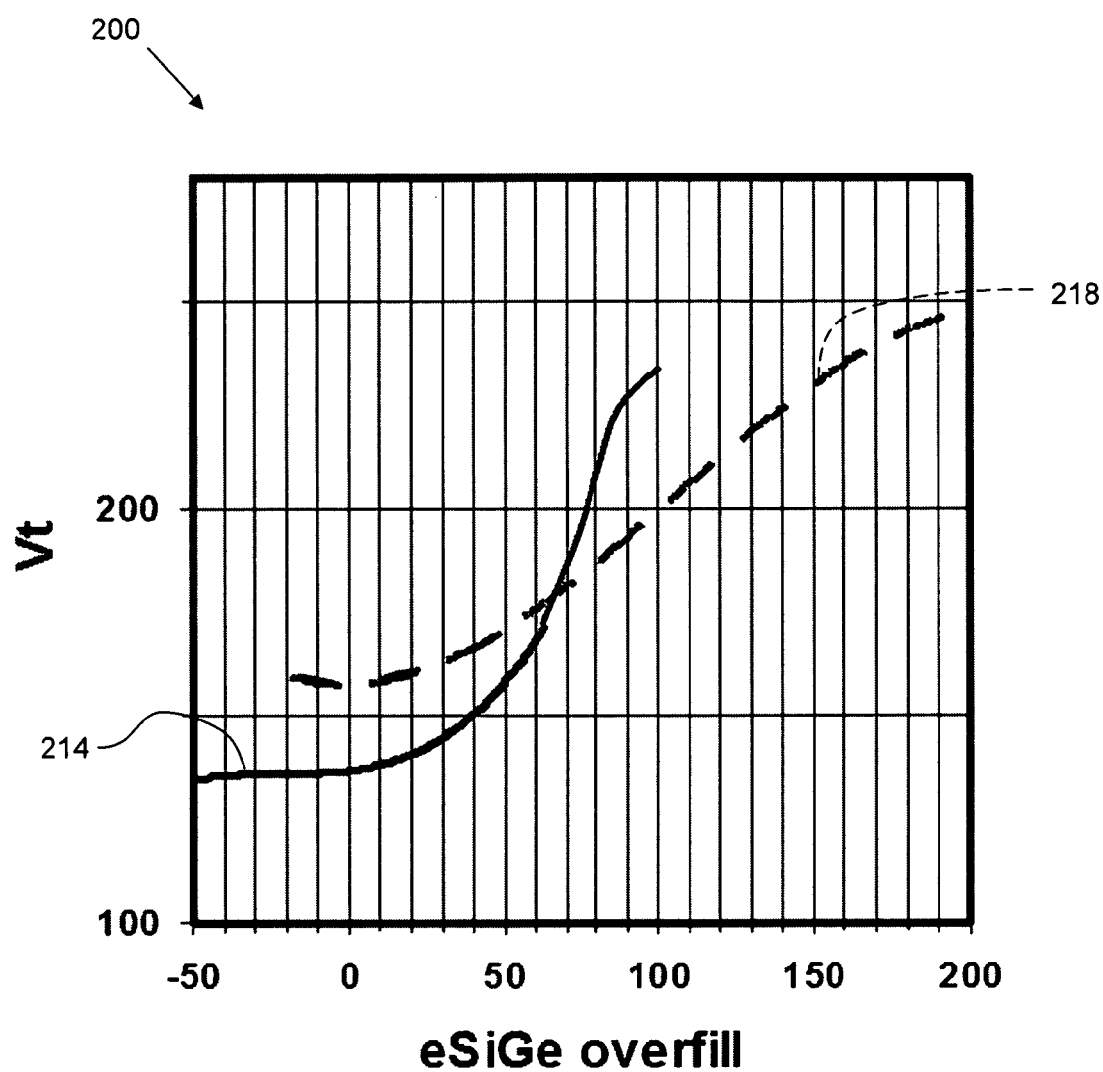
FIG. 2 is a graph showing a relationship between threshold voltage and overfill.

FIG. 2 is a graph 200 showing a relationship between threshold voltage and overfill. The Y axis, labeled Vt, is the threshold voltage in millivolts. The X axis is the amount of eSiGe overfill, in angstroms. Line 214 shows the relationship between Vt and eSiGe overfill when the eSiGe is in a popped condition, wherein the epitaxial growth extends vertically up along the side of the spacer. Line 218 shows the relationship between Vt and eSiGe overfill when the eSiGe is in a "pinned" condition, wherein the eSiGe material does not grow vertically up along the side of the spacer, even when the epi thickness in between the gates is above the gate oxide.

As can be seen by comparing lines 214 and 218, the Vt shown by trend line 218 varies less as a function of eSiGe height than line 214. Therefore, the process that yields a "pinned" morphology results in less device variation, and hence a pinned morphology is more desirable than a popped morphology (which is shown in line 214). However, as stated previously, adjusting conditions to induce a pinned morphology may result in less consistent filling of the source/drain regions for different device widths. While not shown graphically, other parameters, such as Cov, also exhibit a similar reduction in sensitivity when a pinning morphology is used.

FIGS. 3-6 show morphologies of various prior art field effect transistors to provide examples of the aforementioned tradeoffs present in currently used eSiGe methods.

Figure 3:
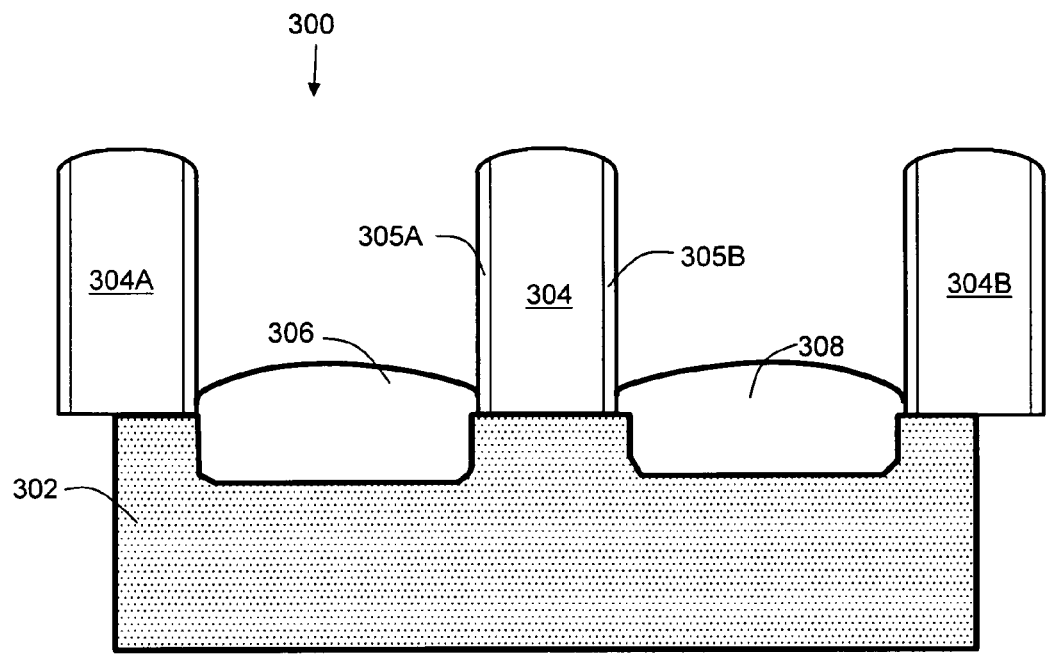
FIGS. 3-6 show morphologies of various prior art field effect transistors.

FIG. 3 shows a field effect transistor 300. Source 306 and drain 308 are filled with eSiGe that was deposited with low hydrogen flow eSiGe into a wide device, where W (see FIG. 1B) is much greater than the epi thickness T For example, in the case of 45 nm technology, a device may be considered "wide" if the value of W is greater than about 300 um. Hydrogen (H2) is the carrier gas that is frequently used in eSiGe selective epitaxial deposition. Typically, process gas (growth precursor) flows are on the order of 5 to 500 sccm (standard cubic centimeters per minute), while the H2 carrier gas flow is around 5-50 slm (standard liters per minute). As to the H2 gas flow, low hydrogen flow is considered to be a flow ranging from about 5 slm to about 10 slm, and high hydrogen flow is considered to be about 11 to 50 slm.

Note that in FIG. 3, source 306 and drain 308 are overfilled, and have a "popped" morphology (contacting spacers 305A and 305B, respectively), which is not ideal in terms of applying stress to the transistor channel.

Figure 4:
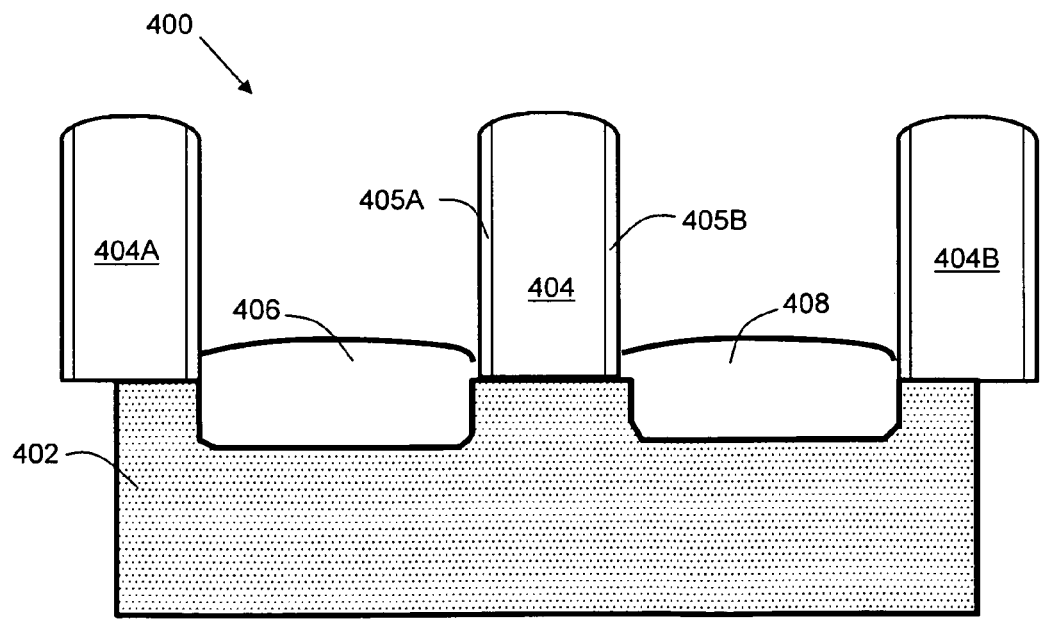

FIG. 4 shows a field effect transistor 400. Source 406 and drain 408 are filled with eSiGe that was deposited with low hydrogen flow eSiGe into a narrow device, where W (see FIG. 1B) is generally equal to or less than T (see FIG. 1B). Source 406 and drain 408 also have a "popped" morphology. By comparing the transistor 300 of FIG. 3 and the transistor 400 of FIG. 4, the effect of device width on eSiGe morphology can be observed.

Overall, a popped morphology may cause the undesirable effect of increasing device sensitivity to variations in epitaxial thickness (T in FIG. 1A). A pinned morphology decreases device sensitivity to variations in epitaxial thickness. However, as will be explained below, various other problems may occur with a pinned morphology.

Figure 5:
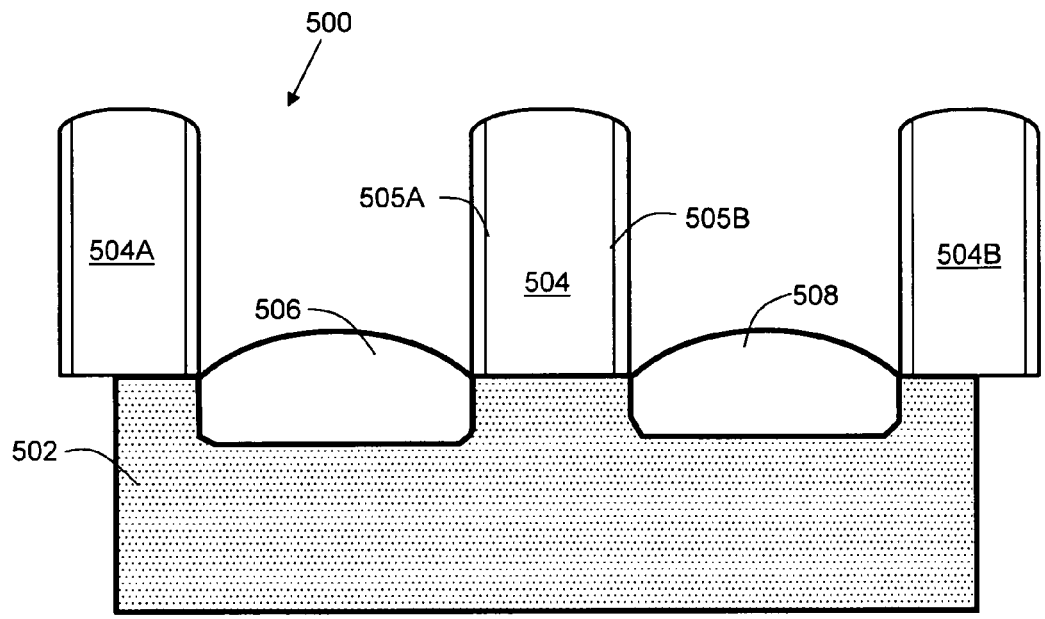

FIG. 5 shows a field effect transistor 500. Source 506 and drain 508 are filled with eSiGe that was deposited with high hydrogen flow eSiGe into a wide device. Note that in FIG. 5, source 506 and drain 508 have a "pinned" morphology, which is better than the popped morphology shown in FIG. 3, in terms of minimizing the device sensitivity to variations in epitaxial thickness (T in FIG. 1A). However, the disadvantage of high hydrogen flow eSiGe is shown in FIG. 6.

Figure 6:
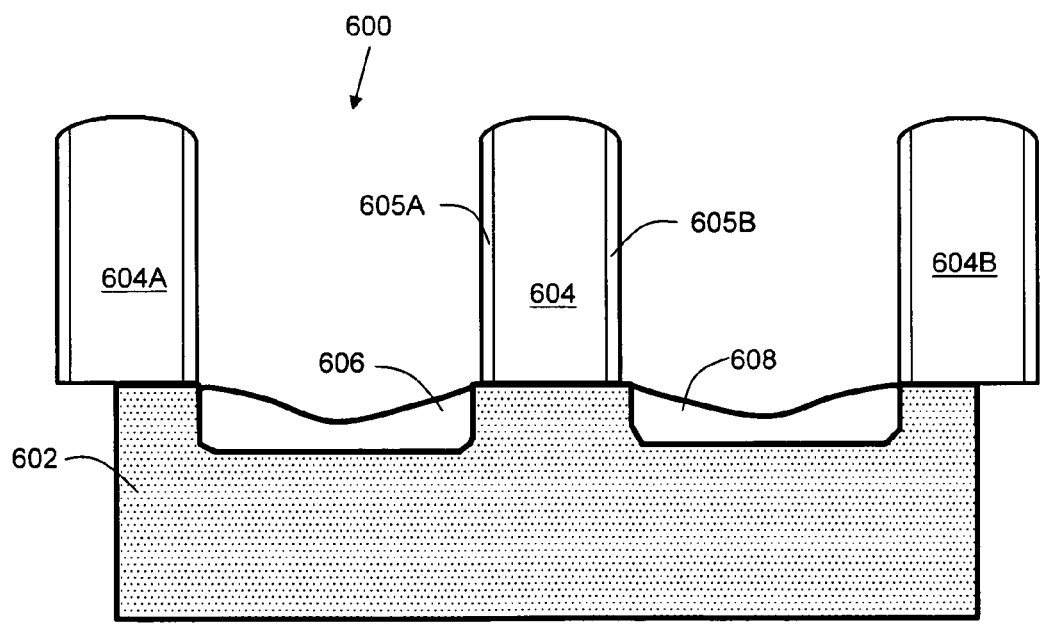

FIG. 6 shows a field effect transistor 600. Source 606 and drain 608 are filled with eSiGe that was deposited with high hydrogen flow eSiGe into a narrow device. Note that in source 606 and drain 608 are not filled equivalent to source 506 and drain 508 shown in FIG. 5. This morphology is not ideal in terms of maintaining equivalent performance across different device widths, as changes to the volume of eSiGe in the source/drain regions can alter important device parameters, such as Vt and Cov, and therefore introduce variations in the device performance across an integrated circuit (IC) chip.

The aforementioned examples illustrate the tradeoff amongst wide and narrow width devices using an eSiGe process. Embodiments of the present invention address the tradeoff by utilizing a novel two-step eSiGe deposition process.

Figure 7:
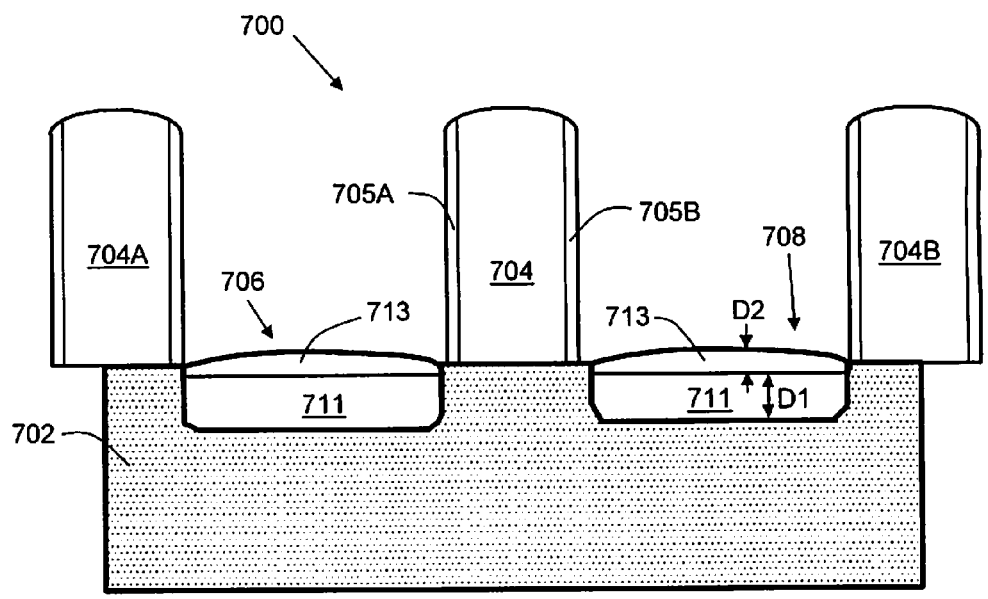
FIG. 7 shows a field effect transistor in accordance with an embodiment of the present invention.

FIG. 7 shows a field effect transistor 700 in accordance with an embodiment of the present invention. Substrate 702 may be comprised of silicon, or may be another suitable substrate, such as SOI (silicon on insulator). Each source (and drain) cavity is filled in a two-step process. Source 706 is comprised of a first eSiGe layer 711, followed by a second eSiGe layer 713. The eSiGe layer 711 is deposited using a low hydrogen flow process, and eSiGe layer 713 is deposited using a high hydrogen flow process. In one embodiment, the process to deposit layer 711 utilizes a hydrogen gas flow (H2) of about 5 slm, and the process to deposit layer 713 utilizes a hydrogen gas flow (H2) of about 15 slm. However, the relative flow values for layer 711 and 713 may change depending on other process parameters, such as pressure, pump speed, or chamber design. Regardless of the specific flow values used, layer 713 is deposited with a higher hydrogen (H2) flow rate than layer 711.

Layer 711 provides the benefit of even eSiGe deposition in narrow region devices. Drain 708 is formed in a similar manner. Using the two-step approach, the advantages of both the low hydrogen flow eSiGe and the high hydrogen flow eSiGe may be realized. In general, the majority of the source and drain is comprised of base layer 711, with only a small portion comprising top layer 713. In one embodiment, layer 711 is filled to just below the level of the bottom of gate 704 (a slight underfill). In this way, the overall fill of the source/drain regions exhibit the consistent fill properties of low flow hydrogen eSiGe. In one embodiment, layer 711 is filled to a level ranging from about 2 nanometers to about 10 nanometers below the bottom of gate 704. The The upper layer 713, being comprised of high flow hydrogen eSiGe, provides the desired morphology that results a "pinning" effect, which serves to reduce the effects of eSiGe fill varation on Vt and Coy as compared to a "popped" morphology.

This reduction in device sensitivity to the eSiGe fill height provides for a more consistent semiconductor fabrication process. Let D1 be the depth of layer 711, and D2 be the depth of layer 713. In one embodiment, layer D1 ranges from about 20 nanometers to about 100 nanometers. In general, the ratio D2/D1 ranges from about 0.1 to about 0.4, which may provide for a source/drain structure exhibiting the advantages of both the low flow hydrogen eSiGe, and the high flow hydrogen eSiGe. In one embodiment, the eSiGe composition used has a germanium composition or germanium concentration level in the range of about 15% to about 40%. It is possible to use the same eSiGe composition or concentration for both the base layer 711, and the top layer 713. It is also possible to have different compositions or concentrations for base layer 711 and top layer 713. In one embodiment, a Ge concentration level of the base layer 711 ranges from about 30% to about 40%, and the top layer 713 has a Ge concentration level from about 15% to about 25%, for example at about 20%.

The eSiGe may be formed by a variety of suitable methods, including, but not limited to, chemical vapor deposition (CVD). The type of CVD used may include a variation such as rapid thermal CVD, low pressure CVD, and atmospheric pressure CVD for example. In one embodiment, the deposition (growth) of the eSiGe occurs in a temperature ranging from about 600 degrees Centigrade to about 900 degrees Centigrade.

Figure 8:
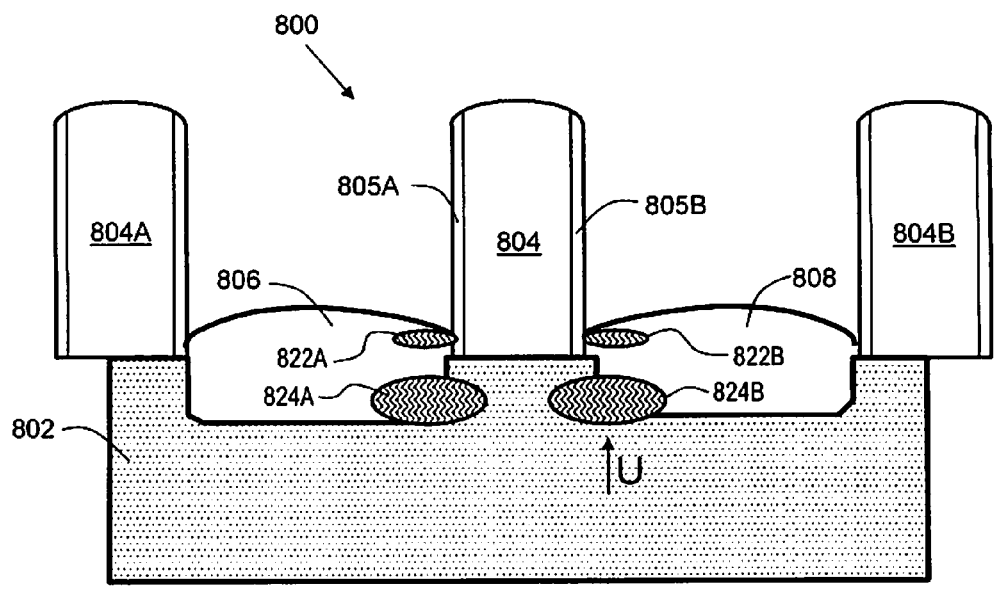
FIG. 8 shows a prior art field effect transistor having a popped morphology.
Figure 9:
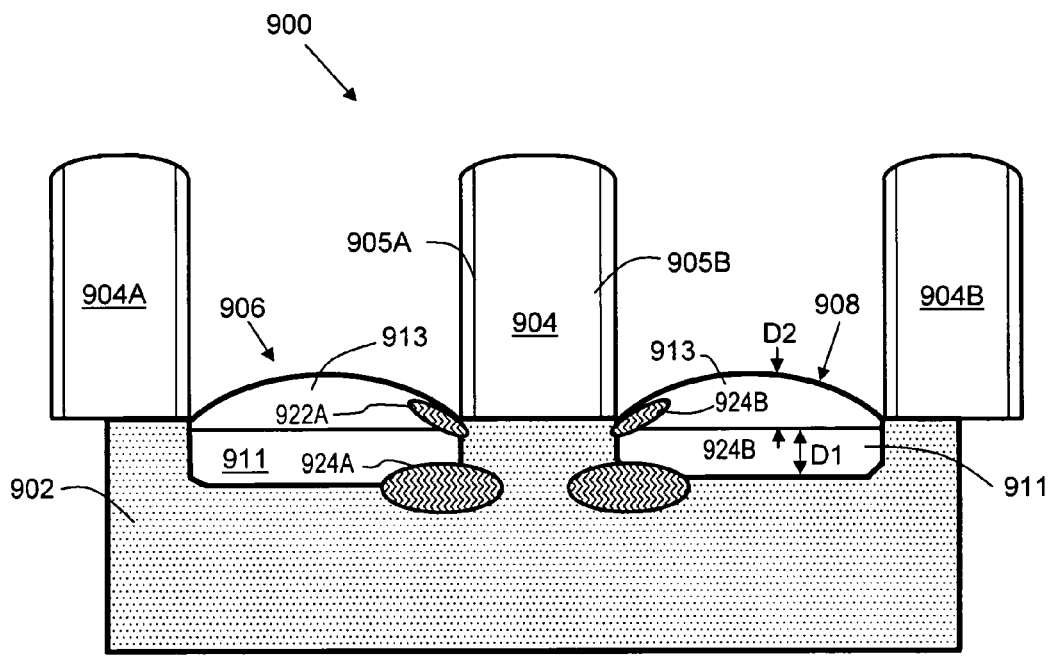
FIG. 9 shows a field effect transistor in accordance with an embodiment of the present invention.

FIG. 8 and FIG. 9 illustrate the positive effects of a pinned morphology. FIG. 8 shows a field effect transistor 800, similar to field effect transistor 300 of FIG. 3. In FIG. 8, implantation regions 822A, 822B, 824A, and 824B are shown. Regions 822A and 822B are commonly referred to as extension regions, and regions 824A and 824B are commonly referred to as halo regions. In the case of field effect transistor 800, the implantation regions (822A, 822B, 824A, 824B) have undesirably shifted upward, indicated by arrow U. Variations in epitaxial thickness (see T, FIG. 1A) will cause the implantation regions to also vary, with respect to the base of the gate 804. It is desirable to reduce these variations, for consistent performance amongst devices spanning multiple production runs.

FIG. 9 shows a field effect transistor 900 in accordance with an embodiment of the present invention, and illustrates the benefits of a pinned morphology. In this embodiment, source 906 and drain 908 were formed with the two-layer approach previously described in the explanation of FIG. 7. In comparing with FIG. 8, it can be observed that implantation regions 922A, 922B, 924A, and 924B are not shifted upwards to the extent of the corresponding regions in FIG. 8. While the extension regions 922A and 922B are angled, due to the pinning morphology, at the base of the gate 904, the extension regions 922A and 922B remain relatively close to the desired position, even if there are fluctuations in the epitaxial thickness, which is the sum of the thickness of base layer 911 (D1), and the thickness of top layer 913 (D2). Note that even when the device width (see W, FIG. 1B) is approximately the same as, or less than, the combined thickness of the base layer 911 and the top layer 913, a pinned morphology is achieved.

Figure 10:
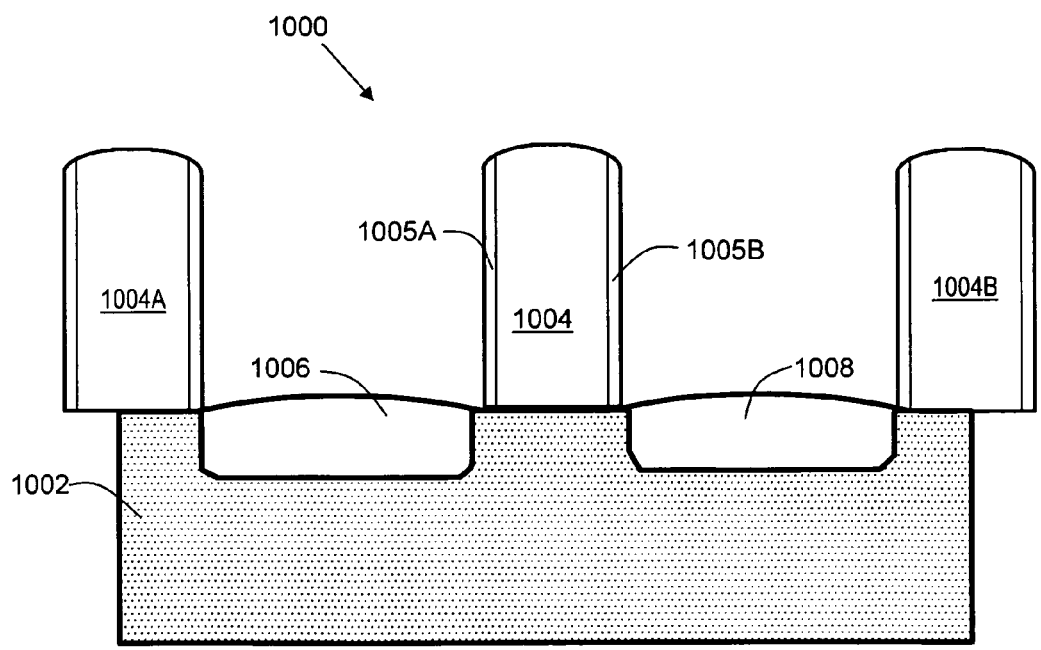
FIG. 10 and FIG. 11 show field effect transistors in accordance with additional embodiments of the present invention.

FIG. 10 shows a field effect transistor 1000 in accordance with an embodiment of the present invention. Source 1006 and drain 1008 are formed using the two-step process described previously in the description of FIG. 7. Transistor 1000 is a wide device. In comparing the source 1006 and drain 1008 of transistor 1000 with source 306 and drain 308 of prior art transistor 300 (see FIG. 3), it can be observed that the morphology exhibited in transistor 800 is pinned, and is more desirable than that of transistor 300, in that the popping present in transistor 300 is avoided in transistor 1000.

Figure 11:
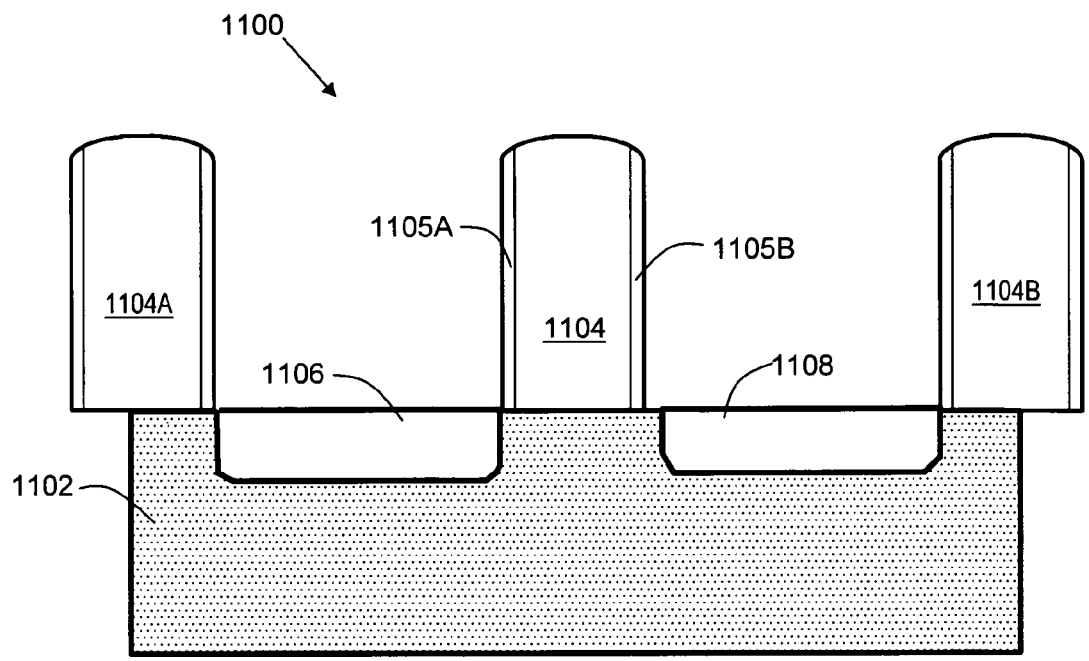

FIG. 11 shows a field effect transistor 1100 in accordance with an embodiment of the present invention. Source 1106 and drain 1108 are formed using the two-step process described previously in the description of FIG. 7. Transistor 1100 is a narrow device. In comparing the source 1106 and drain 1108 of transistor 1100 with source 606 and drain 608 of prior art transistor 600 (see FIG. 6), it can be observed that the morphology exhibited in transistor 1100 is superior to that of transistor 600, in that the eSiGe fill variation of source 606 and drain 608 in transistor 600 is considerably reduced in source 1106 and drain 1108 of transistor 1100.

Therefore, it can be appreciated that embodiments of the present invention provide a transistor and method of fabrication that provide the advantages of both low flow hydrogen eSiGe, and high flow hydrogen eSiGe, and thereby achieves the fabrication goal of reduced device sensitivity to the eSiGe fill levels. After the eSiGe deposition, the remaining fabrication steps are industry standard processes that are known in the art.

Figure 12:
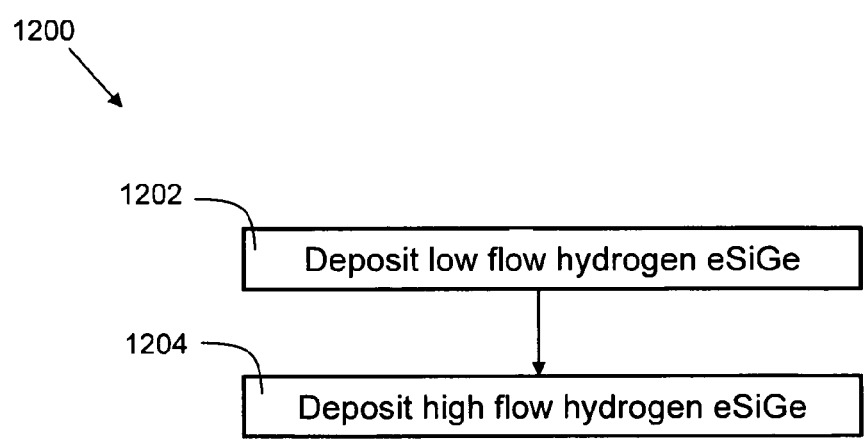
FIG. 12 is a flowchart indicating process steps to perform a method in accordance with an embodiment of the present invention.

FIG. 12 is a flowchart 1200 indicating process steps to perform a method in accordance with an embodiment of the present invention. In process step 1202, low flow hydrogen eSiGe is deposited in source and drain cavities of a field effect transistor. In process step 1204, high flow hydrogen eSiGe is deposited in source and drain cavities of a field effect transistor, and is deposited upon the eSiGe that was deposited in process step 1202.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A transistor formed within a substrate, the transistor comprising:
   a source region;
   a drain region;
   a channel region disposed between the source region and the drain region; and
   a gate disposed above the channel region;
   wherein the source region and the drain region comprise a base layer of low flow hydrogen embedded silicon germanium (eSiGe) deposited by a first hydrogen carrier gas flow of 5 to 10 standard liters per minute (slm) and a top layer of high flow hydrogen eSiGe deposited by a hydrogen gas flow of 11 to 50 slm on the base layer;
   wherein a device width of the transistor is such that the source region is equal to, or less than, the combined height of the base layer and top layer of embedded silicon germanium; and
   wherein the base layer extends to a level below a bottom of the gate and the top layer induces a pinned morphology, wherein the top layer at a position between another transistor is above the base of the gate and is below the base of the gate at the point where the top layer is adjacent to the gate.

2. The transistor of claim 1, wherein a ratio of depth of the top layer to depth of the base layer ranges from about 0.1 to about 0.4.

3. The transistor of claim 1, wherein the base layer extends to a level of about 2 nanometers to about 10 nanometers below the bottom of the gate.

4. The transistor of claim 1, having a device width ranging from about 30 nanometers to about 100 nanometers.

5. The transistor of claim 1, wherein the base layer and the top layer have a germanium concentration level ranging from about 15 percent to about 40 percent.

6. The transistor of claim 1, wherein the base layer has a germanium concentration level ranging from about 30 percent to about 40 percent.

7. The transistor of claim 6, wherein the top layer has a germanium concentration level from about 15 percent to about 25 percent.

8. The transistor of claim 7, wherein the top layer has a germanium concentration level of about 20 percent.

9. A SRAM device, comprising a plurality of transistors formed within a substrate, the transistors comprising:
   a source region;
   a drain region;
   a channel region disposed between the source region and the drain region; and
   a gate disposed above the channel region;
   wherein the source region and the drain region comprise a base layer of low flow hydrogen eSiGe and a top layer of high flow hydrogen eSiGe deposited on the base layer; and wherein the base layer extends to a level of about 2 nanometers to about 10 nanometers below the bottom of the gate and the top layer induces a pinned morphology, wherein the top layer at a position between another transistor is above the base of the gate and is below the base of the gate at the point where the top layer is adjacent to the gate; and wherein at least one of the plurality of transistors has a device width of the source region that is equal to, or less than, the combined height of the base layer and top layer of embedded silicon germanium.

10. The SRAM device of claim 9, wherein the base layer of low flow hydrogen eSiGe is deposited by a hydrogen carrier gas flow of 5 to 10 slm to a level below a bottom surface of the gate and the top layer of high flow hydrogen eSiGe is deposited by a hydrogen gas flow of 11 to 50 slm on the base layer.

11. The SRAM device of claim 10, at least one of the plurality of transistors has a ratio of depth of the top layer to depth of the base layer in the range from about 0.1 to about 0.4.

12. The SRAM device of claim 11, wherein at least one of the plurality of transistors has a base layer and top layer comprising a germanium concentration ranging from about 15 percent to about 40 percent.

13. The SRAM device of claim 11, wherein at least one of the plurality of transistors has a device width ranging from about 30 nanometers to about 100 nanometers.

* * * * *